United States Patent [19]

Ahlskog

[11] Patent Number: 5,439,127

[45] Date of Patent: * Aug. 8, 1995

[54] CONTROL STATION COVER

[76] Inventor: Chris V. Ahlskog, 4206 - 149 Street, Edmonton, Alberta, Canada, T6H 5L9

[ * ] Notice: The portion of the term of this patent subsequent to Dec. 21, 2010 has been disclaimed.

[21] Appl. No.: 97,843

[22] Filed: Jul. 15, 1993

Related U.S. Application Data

[63] Continuation-in-part of Ser. No. 831,349, Feb. 5, 1992, Pat. No. 5,271,514, which is a continuation of Ser. No. 611,786, Nov. 13, 1990, abandoned.

[51] Int. Cl.$^6$ .............................................. B65D 25/20
[52] U.S. Cl. ................................... 220/3.7; 220/3.8; 220/326; 220/378; 220/730
[58] Field of Search .................. 220/3.8, 3.6, 3.7, 323, 220/326, 378, 724, 730, 731; 174/67, 48

[56] References Cited

U.S. PATENT DOCUMENTS

| | | | |
|---|---|---|---|
| 2,359,628 | 10/1994 | Daly | 220/3.8 X |
| 2,656,948 | 10/1953 | McGee | 220/3.8 X |
| 2,804,986 | 9/1957 | Jeffers et al. | 220/3.8 X |
| 3,686,425 | 8/1972 | Zerwes et al. | 174/53 |
| 3,746,207 | 7/1973 | Lenhart | 220/326 |
| 4,036,396 | 7/1977 | Kennedy et al. | 174/67 X |
| 5,077,452 | 12/1991 | Mathers et al. | 220/3.8 X |

*Primary Examiner*—Allan N. Shoap
*Assistant Examiner*—Vanessa Caretto

[57] ABSTRACT

The main theme in the design of this invention is to provide adequate protection while allowing for easy installation and removal without interrupting the operation of the device which is being protected. The two most important components of this invention are the use of resilient clips on the side walls with each clip having a leg extending inwardly allowing this leg to be inserted between the device and the surface, the second important component is the use of gasket material between the frame and the device to be protected. This combination allows for protection from the elements and from accidental operation even without either open end being covered.

1 Claim, 1 Drawing Sheet

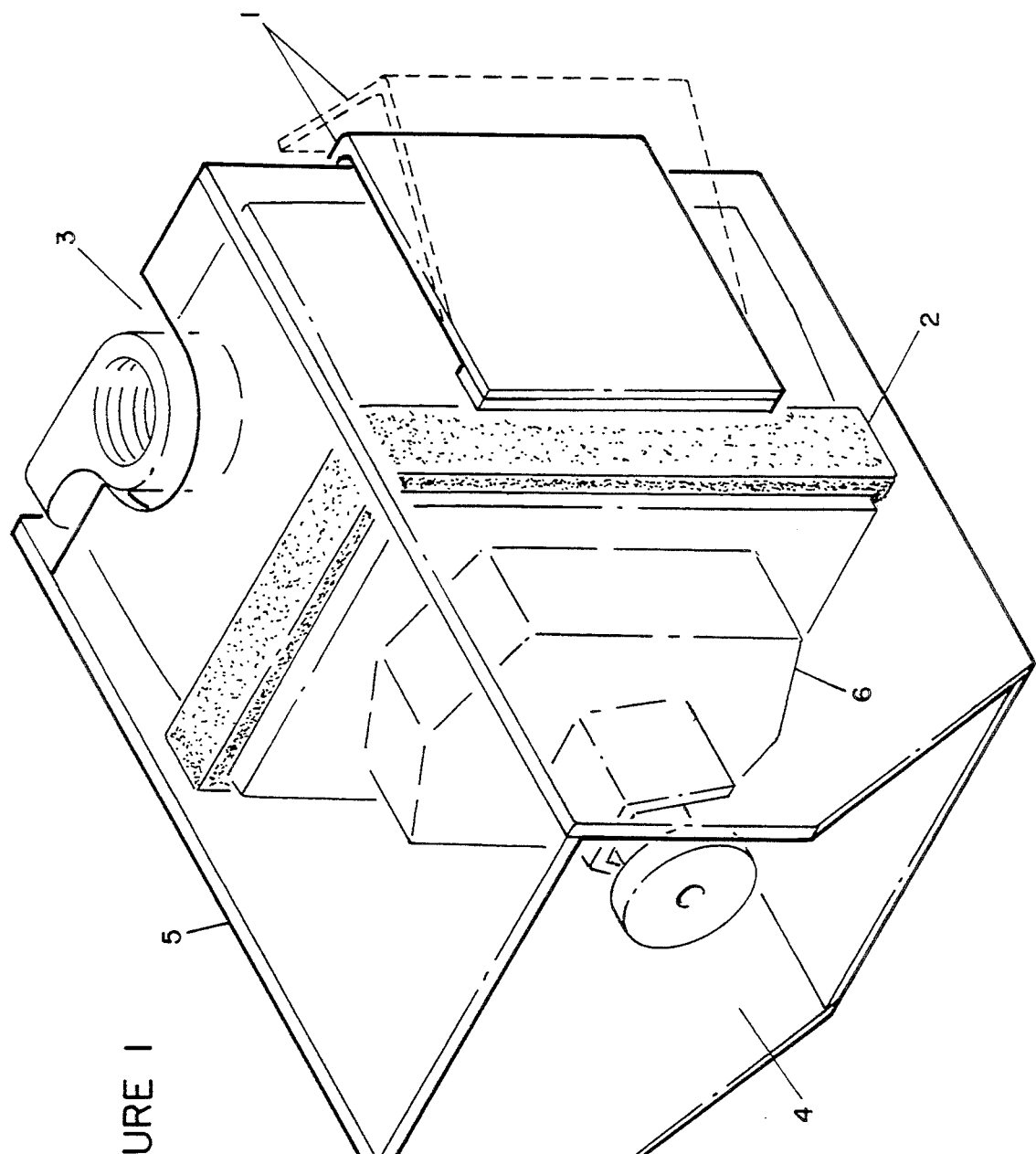

CONTROL STATION COVER

This application is a continuation in part of U.S. Ser. No. 07/831,349, filed Feb. 5, 1992, now U.S. Pat. No. 5,271,514, which is a continuation of U.S. Ser. No. 07/611,786, filed Nov. 13, 1990, now abandoned.

FIELD OF THE INVENTION

This invention relates to covers for all types of electrical and electronic control stations.

BACKGROUND OF THE INVENTION

The Industrial environment contains electrical and electronic control devices that are subject to many and various destructive elements. These elements include Oil, Water, Steam, Corrosive Fluids, Dirt, Dust, Sand and Mud. The distinct possibility for damage due to bumping, banging and accidental operation is a constant worry. The control stations that we are concerned with are the control stations that are already installed and operating. This invention helps satisfy the need for an easy to install cover that can and does protect the devices from bumping, banging and accidental operation, as well as from dripping liquids and sprays from top, bottom or from either side.

SUMMARY OF THE INVENTION

This invention provides a cover assembly for a control station comprising one distinct section. A substantially rectangular, but not restricted to rectangular, open ended box. This box shall be of a sufficient depth to allow protection from dripping liquids. This box shall be close fitting to allow protection from accidental operation. This box incorporates a design that is notched in one or more sides in such a way as to not interfere with the conduit entering the control station. The box has a gasket situated in such a way as to create a barrier to the ingress of liquid, steam dust etc. thru the opening at the bottom of the four sides. The box also incorporates the use of two sprung latches secured to the box and installed in such a way as to allow the latches to be pulled to the side during installation and to be pushed under the control station after installation. The box is held to the control station thru the dual use of the sprung latches and the friction fit caused by the compression of the mid point sealing gasket. The second open side shall be left open. This second open side may be left as a rectangular opening or may be tapered to facilitate operation of the control station as in FIG. 1. This cover must be made of a material which is strong enough to withstand the rigors which can reasonably be expected in the industrial field. eg: steel, aluminum, fiberglass, plastic, plexi glass etc.

BRIEF DESCRIPTION OF THE DRAWING

There will now be described a preferred embodiment of the invention, with reference to the drawing, by way of illustration, in which like numerals denote like elements and in which:

FIG. 1 is a perspective view of a preferred embodiment of the invention, showing the cover installed on a control device, also showing the sprung latches or resilient clips, the mid point gasket, and showing the conduit opening in the top only. This cover is built to exacting measurements for each style or manufacture of control station.

DETAILED DESCRIPTION OF THE INVENTION

Referring to FIG. 1, the Description is as follows. Item 1 shows the sprung latches or resilient clips. These are made of a flexible material that allows a sideways movement upon installation yet will orient back to the normal position once the cover is in place, and there are preferably two latches, one on either side of the cover assembly. This material may be plastic, metal, fiberglass or other resilient material. Item 2 is the midpoint gasket. This gasket is positioned so that liquid entering the conduit opening, item 3, will not flow towards the front opening, item 4, of the cover, item 5. The gasket may be of any resilient material, preferably a foam silicone rubber. This gasket may sometimes take the form of expanding Polyurethane expanding foam. The gasket must be compressed between the cover, item 5 and the control station, item 6, in such a way that it creates a barrier to all liquid, steam etc. and also creates enough friction to assist in holding the cover in place. Item 3 is the conduit opening. This opening is designed to allow the conduit to enter the device box without the need to remove or shut down the control device during installation or removal of the cover. This opening is normally on two sides and may be on any number of sides. Item 4 is the open front of the cover which may be tapered to enhance accessibility. Item 5 is the cover. Item 6 is the control device that the cover is mounted on.

OPERATION OF PREFERRED EMBODIMENTS

Firstly, an appropriate cover assembly is chosen that fits the subject control station. The sprung latch is grasped and pulled to the side. The gaskets are then lined up with the edge of the control device box and the cover is slid into position. After the cover has been completely pushed onto the control device, the sprung latch can then slide back into the normal position. For maintenance of the control device the cover may be removed simply by again moving the sprung latch to the side and pulling the unit off of the control device. Total time for installation or removal of the cover unit is less than one minute, and either action may be preformed without disrupting the operation of the control device.

ALTERNATIVE EMBODIMENTS

A person skilled in the art could make immaterial modifications to the invention described and claimed in this patent without departing from the essence of the invention. This essence being an extremely quick convenient method of providing protection for the operating control station without the need to interrupt the operation of that control station during installation or removal.

I claim:

1. A cover assembly for a control device mounted to a surface, said cover assembly comprising: a substantially rectangular frame of two pairs of opposed side walls, an open top, and an open bottom; said frame having two resilient clips, a resilient clip being attached to each respective opposed side wall of one of said pairs of said side walls, each of said resilient clips having a leg extending inwardly from said side wall to fit between the surface and the control device to removably secure said cover assembly to the control device; said frame having a length of gasket material mounted on an inside surface of each said side wall intermediate said open top and said open bottom and extending the length of each said side wall to seal against the control device, the gasket material on each said side wall functioning to prevent the transfer of fluid or particulate matter from said open bottom; said frame having a conduit opening in at least one of said side walls, the conduit opening extending from an edge of said one side wall closest to the control device; said frame being of sufficient depth so as to provide protection from dripping liquids and accidental operation.

* * * * *